(12) United States Patent
Tolchinsky et al.

(10) Patent No.: US 7,491,988 B2
(45) Date of Patent: Feb. 17, 2009

(54) TRANSISTORS WITH INCREASED MOBILITY IN THE CHANNEL ZONE AND METHOD OF FABRICATION

(75) Inventors: Peter G. Tolchinsky, Beaverton, OR (US); Mark Bohr, Aloha, OR (US); Irwin Yablok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/880,311

(22) Filed: Jun. 28, 2004

(65) Prior Publication Data

US 2005/0285212 A1    Dec. 29, 2005

(51) Int. Cl.
*H01L 29/72* (2006.01)

(52) U.S. Cl. ............... 257/289; 257/192; 257/194; 257/347; 257/401; 257/402; 257/408; 257/745; 438/142; 438/197

(58) Field of Classification Search ............ 257/745, 257/315, 202, 408, 192, 194, 289, 347, 401, 257/402; 438/604, 605, 653, 142, 197
See application file for complete search history.

(56) References Cited

U.S. PATENT DOCUMENTS 6,271,551 B1 * 8/2001 Schmitz et al. ............ 257/288

| | | | |
|---|---|---|---|
| 2004/0099901 A1 * | 5/2004 | Ludwig | 257/315 |
| 2004/0256639 A1 * | 12/2004 | Ouyang | 257/202 |
| 2005/0093154 A1 * | 5/2005 | Kottantharayil | 438/604 |
| 2005/0250289 A1 * | 11/2005 | Babcock et al. | 438/309 |

OTHER PUBLICATIONS

H. Rucker et al., "Suppressed diffusion of boron and carbon in carbon-rich silicon", Applied Physics Letters, vol. 73, No. 12, Sep. 21, 1998, pp. 1682-1684, American Institute of Physics 1998.

* cited by examiner

*Primary Examiner*—Edward Wojciechowicz
(74) *Attorney, Agent, or Firm*—Blakely, Sokoloff, Taylor & Zafman LLP

(57) ABSTRACT

A semiconductor transistor structure with increased mobility in the channel zone and a method of its fabrication are described. A semiconductor substrate having a first dopant is formed. A diffusion barrier layer having a second dopant is formed on the semiconductor substrate to suppress outdiffusion of the first dopant. Next, a semiconductor layer having substantially low dopant concentration relative to the first layer is epitaxially grown on the diffusion barrier layer. The semiconductor layer defines a channel in the semiconductor transistor structure. The low dopant concentration in the semiconductor layer increases the mobility of the carriers in the channel of the semiconductor transistor structure. A gate electrode and a gate dielectric are formed on the semiconductor layer with the low dopant concentration.

28 Claims, 8 Drawing Sheets

TRANSISTORS WITH INCREASED MOBILITY IN THE CHANNEL ZONE AND METHOD OF FABRICATION

FIELD

This invention relates to the field of semiconductor manufacturing, and more specifically, to a semiconductor transistor and its manufacture.

BACKGROUND

The size of a metal-oxide-semiconductor ("MOS") transistor has been continuously scaled down in the past decades in order to meet performance and density requirements for the transistors. Scaling down of the transistor size reduces area capacitance and increases the speed of the transistor. Various transistor designs or process options are used to improve the transistor performance. For example, use of Silicon-on-Insulator ("SOI") technology in the transistor fabrication reduces current leakage into the silicon surrounding the transistor. This decreases the power requirements of the transistor and improves performance of the transistor.

One way to improve performance of the transistor is to increase the transistor speed by creating a strained channel. FIG. 1 illustrates a semiconductor transistor structure 200 having a strained channel 201 with increased electron mobility. The strained channel 201 is made of a strained Si layer epitaxially grown on the silicon germanium ("SiGe") substrate 202. A gate dielectric 203 is placed between a gate electrode 204 and the strained channel 201. A source region 205 and a drain region 206 are on the opposing sides of the gate electrode 204. A lattice constant that denotes the size of the unit cell in a crystal lattice is smaller for Si material than for SiGe material. Such difference in the lattice constants of Si material and SiGe material produces a tensile strain in the Si layer grown on the SiGe substrate. The tensile stress in the Si layer increases the mobility of electrons. The tensile stress, however, does not affect significantly the mobility of holes.

Another technique of forming a stressed transistor channel is described in the U.S. Pat. No. 6,621,131. FIG. 2 shows a semiconductor transistor structure 300 with the SiGe alloy source 40A and drain 40B films epitaxially grown in the recesses etched into a layer of epitaxial Si 10 on opposing sides of the gate electrode 18. Because SiGe has a larger lattice constant than Si, it induces a compressive stress in the layer of epitaxial Si 10 under the gate electrode 18 between the source 40A and drain 40B films, such that a compressively strained transistor channel 30 is formed. The semiconductor transistor structure 300 also includes the gate dielectric 14 placed between the gate electrode 18 and the layer of epitaxial Si 10, and the spacers 26A and 26B along the sidewalls of the gate electrode 18, as shown in FIG. 2. FIG. 2 also shows the field isolation regions 12 that isolate wells of different conductivity types and isolate adjacent transistors. The compressive stress in a transistor channel 30 increases the mobility of holes. To create a tensile stressed transistor channel with increased mobility of electrons, SiC alloy is deposited into the recesses formed in the epitaxial Si layer on opposing sides of the gate electrode. Because SiC has smaller lattice constant than Si, it induces a tensile stress in the Si layer under the gate electrode between the source and drain films, such that a tensile strained transistor channel is created.

The compressively strained transistor channel for holes and tensile strained transistor channel for electrons require the materials that have different lattice constants relative to the lattice constant of the substrate that can result in more processing steps and complicate the transistor manufacturing. In addition, epitaxial growth of the semiconductor materials having different lattice constants on one another can create excess defects on the growth interface.

BRIEF DESCRIPTION OF THE DRAWINGS

The present invention is illustrated by way of example and not limitation in the figures of the accompanying drawings, in which like references indicate similar elements, in which.

DETAILED DESCRIPTION

Figure 1:
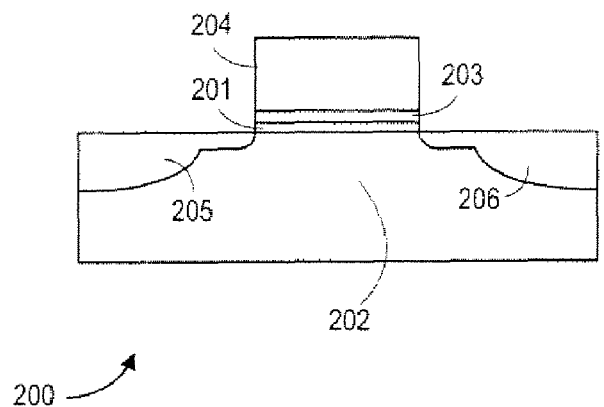
FIG. 1 illustrates a prior art semiconductor transistor structure, wherein a tensile strained Si channel with increased electron mobility is epitaxially grown on a SiGe substrate.
Figure 2:
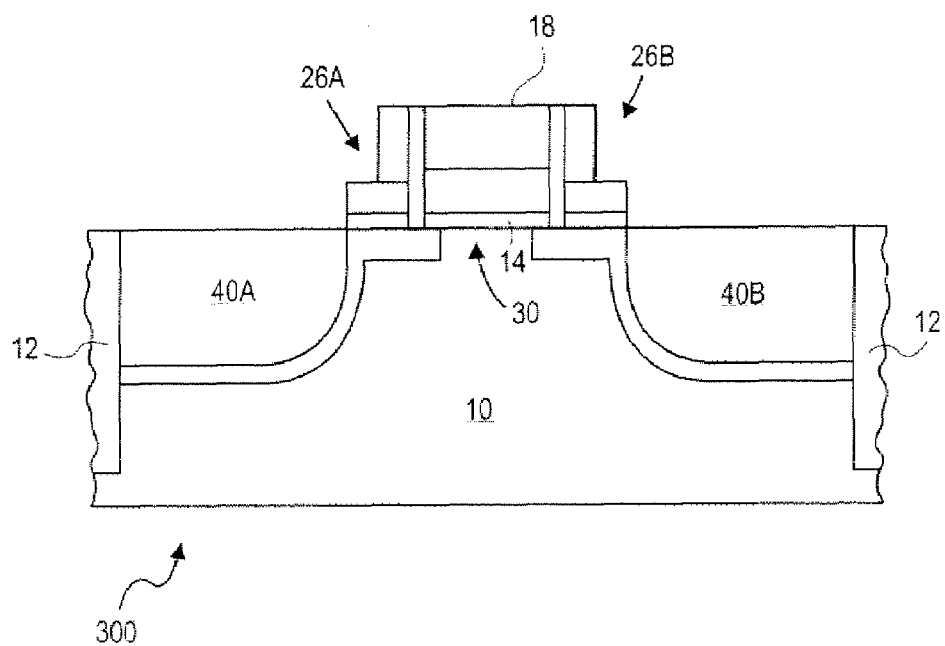
FIG. 2 illustrates a prior art semiconductor transistor structure, wherein a compressively strained Si channel with increased hole mobility is formed between SiGe films epitaxially grown in the source and drain recesses.

In the following description, numerous specific details, such as the specific materials, dopant concentrations, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "for one embodiment" or "for an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

A semiconductor transistor structure having an increased mobility in a channel zone and a method of its fabrication are described herein. Various scattering processes on doping atoms decrease mobility of electrons and holes ("carriers") in the semiconductor transistor structure. To reduce degradation of the carrier mobility, a dopant concentration in the channel zone of the transistor has been reduced increasing the mobility of carriers by a factor of 1.2 to 10. A well having a first dopant is formed in a substrate. Subsequently, a diffusion barrier layer having a second dopant is formed on the well to suppress the first dopant outdiffusion, for example, into a channel region formed in a semiconductor transistor structure. A layer having substantially low dopant concentration is formed on the diffusion barrier layer to create, for example, a channel in the semiconductor transistor structure. Low doping concentration in the transistor channel results in the increased carrier mobility improving the transistor performance, in particular, the speed and current-voltage I-V characteristics of the transistor.

Figure 3:
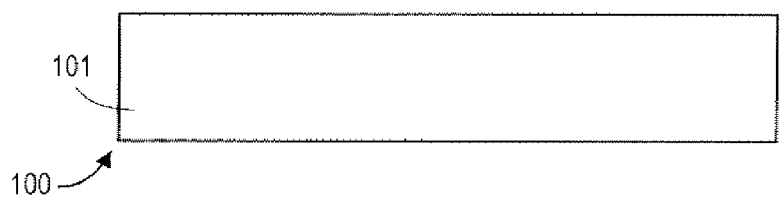
FIG. 3 is a cross-sectional view of a substrate to fabricate a transistor with increased mobility in the channel zone according to one embodiment of the invention.

FIG. 3 is a cross-sectional view of a substrate 100 to fabricate a transistor structure with increased mobility in the channel zone according to one embodiment of the invention. The substrate 100 may include any semiconductor material to make any of integrated circuits, passive, and active devices. For one embodiment, the substrate 100 includes an epitaxially grown silicon ("Si") layer on a monocrystalline silicon wafer. For another embodiment, the substrate 100 includes a silicon-on-insulator ("SOI"). For yet another embodiment, the substrate 100 includes a silicon germanium ("SiGe") layer. For alternate embodiments, the substrate 100 may include III-V and other compound semiconductors, for example, indium phosphate, gallium arsenide, gallium nitride, and silicon carbide.

Figure 4:
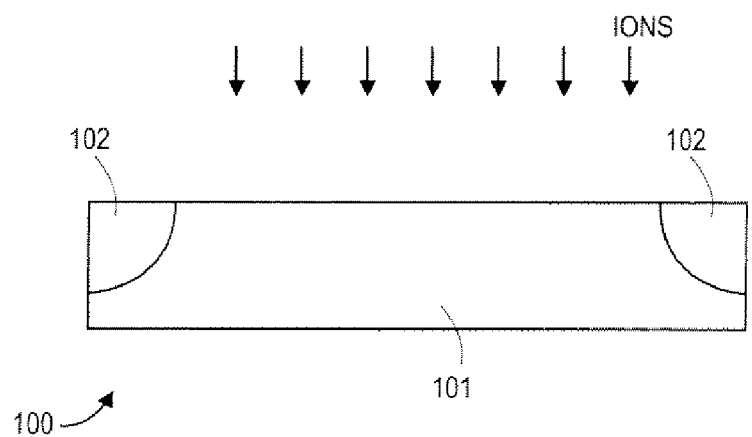
FIG. 4 is a cross-sectional view of a semiconductor substrate after forming shallow trench isolation regions.

The substrate 100 is doped to form a well 101 of a transistor structure, as illustrated in FIG. 4. The well 101 is formed by doping the substrate 100 with either the n-type dopant or the p-type dopant. To form an n-MOS transistor structure, the silicon substrate is doped with a p-type dopant, for example, boron, such that a p-well is formed. For one embodiment, the p-type dopant concentration in the p-well is at least higher than $10^{16} cm^{-3}$. For an embodiment, the p-type dopant concentration in the p-well is in the approximate range of $2 \times 10^{16} cm^{-3}$ to $2 \times 10^{19} cm^{-3}$. To form a p-MOS transistor structure, the silicon substrate is doped with an n-type dopant, for example, arsenic and phosphorous, such that an n-well is formed. For one embodiment, the n-type dopant concentration in the n-well is at least higher than $10^{16} cm^{-3}$. For an embodiment, the n-type dopant concentration in the n-well is in the approximate range of $2 \times 10^{16} cm^{-3}$ to $2 \times 10^{19} cm^{-3}$. For one embodiment, the semiconductor substrate is doped by an ion implantation technique. Ion implantation can displace the atoms of the substrate 100 into the interstitial positions in the crystal lattice such that the concentration of self-interstitial atoms in the substrate 100 increases. For another embodiment, the substrate 100 is doped by a diffusion technique.

FIG. 4 also illustrates isolation regions 102 formed in the substrate 100. For one embodiment, isolation regions 102 may be shallow trench isolation ("STI") regions that may be formed by etching trenches in the substrate 100 and filling the trenches with a dielectric oxide material. Presence of oxygen during formation of the STI regions 102 and during processing of the semiconductor substrate 100 may also increase concentration of self-interstitial atoms in the substrate 100.

Because dopants in the substrate 100 may diffuse via interstitial mechanism, diffusivity of the dopants depends on concentration of interstitial atoms. Ion implantation and oxidation processes may enhance the dopant diffusivity in the substrate 100. For example, ion implantation of a silicon substrate by any one of a p-type dopant or an n-type dopant increases self-interstitial concentration of Si atoms in the silicon substrate. It means that implanting the silicon substrate with, for example, boron, phosphorus, or arsenic ions enhances diffusivity of boron, phosphorus, or arsenic ions respectively.

Figure 5:
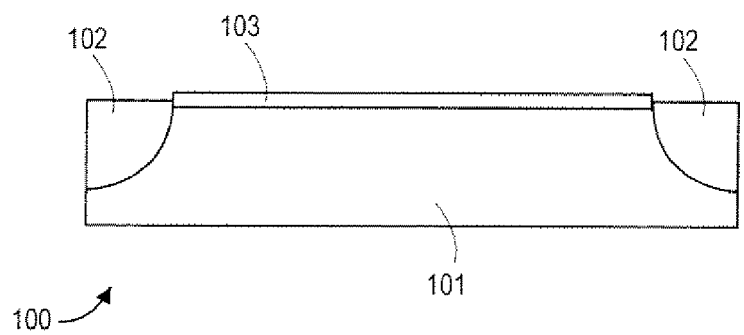
FIG. 5 is a view similar to FIG. 4, after forming a diffusion barrier layer on the substrate.

Next, as shown in FIG. 5, a diffusion barrier layer 103 is formed on the substrate 100. The diffusion barrier layer 103 covers the well 101. The diffusion barrier layer 103 suppresses the dopant outdiffusion from the well 101. The diffusion barrier layer 103 is formed after the well implantation in the transistor channel zone. The diffusion barrier layer 103 may be formed by one of ordinary skill in the art of semiconductor fabrication technique, for example, Molecular Beam Epitaxy ("MBE"), an ion implantation, and Chemical Vapour Deposition ("CVD"). The diffusion barrier layer 103 formed on the well 101 has a thickness sufficient enough to suppress the dopant outdiffusion from the well 101. For one embodiment, the diffusion barrier layer 103 formed on the well 101 has the thickness sufficient enough to suppress the thermal diffusion of the dopants from the well 101. For one embodiment, the diffusion barrier layer 103 formed on the well 101 is substantially thin. In more specific embodiment, the thickness of the diffusion barrier layer 103 formed on the well 101 is in the approximate range of two to twenty atomic layers. For another embodiment, the thickness of the diffusion barrier layer 103, which covers the well 101, is in the approximate range of 5 Å to 1000 Å. For an embodiment, the diffusion barrier layer 103 covering the well 101 formed in silicon substrate includes substitutional carbon ("C") to suppress the outdiffusion of the dopants. For alternate embodiments, the diffusion barrier layer 103 covering the well 101 formed in silicon substrate may include any one of silicon with carbon ("Si:C") and silicon germanium with carbon ("SiGe:C"). The diffusion barrier layer 103 can have the concentration of carbon in the approximate range of $10^{17} cm^{-3}$ to $2 \times 10^{21} cm^{-3}$ and suppress dopant outdiffusion by at least 95%. For one embodiment, the diffusion barrier layer 103, which includes substitutional C, covers the p-well formed in the silicon substrate to suppress outdiffusion of the p-type dopants, for example, boron. For another embodiment, the diffusion barrier layer 103, which includes substitutional C, covers the n-well formed in the silicon substrate to suppress the outdiffusion of n-type dopants, for example, phosphorus and arsenic. For yet another embodiment, the diffusion barrier layer 103, which covers the well 101, includes $A^3B^5$ and other semiconductor materials, for example, indium phosphate, gallium arsenide, gallium nitride, and silicon carbide.

Figure 6:
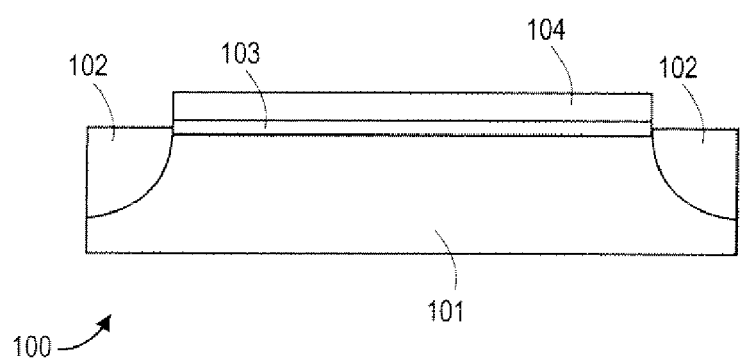
FIG. 6 is a view similar to FIG. 5, after forming a semiconductor layer with substantially low dopant concentration on the diffusion barrier layer.

FIG. 6 shows a semiconductor layer 104 with substantially low dopant concentration formed on the diffusion barrier layer 103 to provide a channel zone with increased mobility of the carriers. The semiconductor layer 104 has substantially low dopant concentration relative to the dopant concentration in the well 101. The substantially low dopant concentration in the semiconductor layer 104 means less scattering of electrons and holes ("carriers") on doping atoms resulting in the higher mobility of the carriers. For example, the mobility of the carriers in the semiconductor layer 104 can increase by at least factor of 1.5 to 10 with respect to the mobility of the carriers in the well 101. The semiconductor layer 104 may be formed, for example, by any one of the MBE and CVD technique. For one embodiment, the dopant concentration in the semiconductor layer 104 formed on the diffusion barrier layer 103 is less than $10^{16}$ cm$^{-3}$. For one embodiment, the semiconductor layer 104 formed on the diffusion barrier layer 103 is thick enough to form a transistor channel region with inversed conductivity, where the current from a source region to a drain region of the semiconductor transistor is going to flow. For one embodiment, the thickness of the semiconductor layer 104 formed on the diffusion barrier layer 103 is in the approximate range of 100 Å to 3 microns ("μm"). For an embodiment, the semiconductor layer 104 formed on the diffusion barrier layer 103 is an intrinsic semiconductor, for example, an intrinsic Si or an intrinsic SiGe. For another embodiment, the semiconductor layer 103 may be doped using a technique, which is known to one of ordinary skill in the art of semiconductor fabrication, for example, using a diffusion technique.

For one embodiment, the intrinsic Si layer is formed on the Si:C diffusion barrier layer, which covers any one of the n-well and p-well formed in the silicon substrate. For another embodiment, the intrinsic Si layer is formed on the SiGe:C diffusion barrier layer, which covers any one of the n-well and p-well formed in the silicon substrate. For yet another embodiment, the intrinsic SiGe layer is formed on the Si:C diffusion barrier layer, which covers any one of the n-well and p-well formed in the silicon substrate. For yet another embodiment, the intrinsic SiGe layer is formed on the SiGe:C diffusion barrier layer, which covers any one of the n-well and p-well formed in the silicon substrate.

Figure 7:
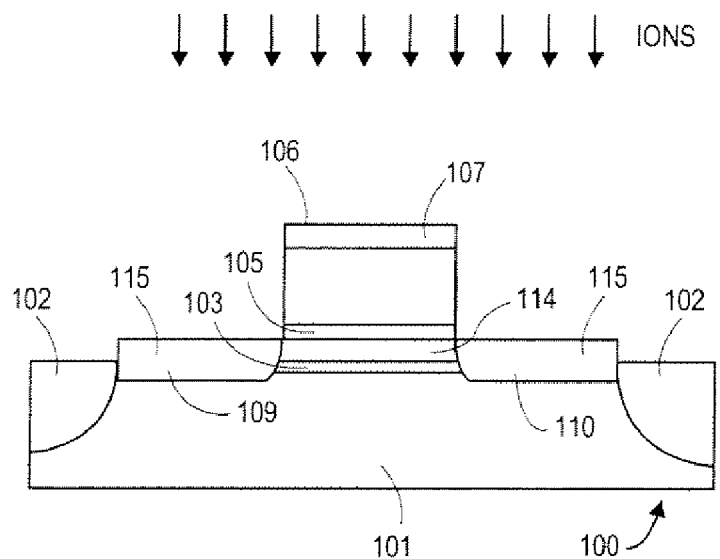
FIG. 7 is a view of a semiconductor transistor structure after a gate electrode with underlying gate dielectric is formed on a portion of the semiconductor layer with substantially low dopant concentration.

FIG. 7 illustrates a semiconductor transistor structure 121, after a gate electrode 106 with underlying gate dielectric 105 is formed on a portion 114 of the semiconductor layer 104 shown in FIG. 6. The portion 114 of the semiconductor layer 104 sandwiched between the gate dielectric 105 and the diffusion barrier layer 103 defines a channel zone with increased mobility of the carriers in the transistor structure 121. The gate dielectric 105 may be formed using a technique, which is known to one of ordinary skill in the art of transistor fabrication, for example, using any one of a growth and a blanket deposition technique. For one embodiment, the gate dielectric 105 may include any one of silicon dioxide ("$SiO_2$"), silicon oxynitride ("$SiO_xN_y$"), and silicon nitride ("$Si_3N_4$"). For another embodiment, the gate dielectric 105 may include an oxide of a transition metal that has a dielectric constant k higher than the dielectric constant of $SiO_2$, for example, zirconium oxide ("$ZrO_2$"), hafnium oxide ("$HFO_2$"), and lanthanum oxide ("$La_2O_4$"). For an embodiment, the thickness of the gate dielectric 105 may be between 5 Å and 100 Å.

The gate electrode 106 is formed on the gate dielectric 105, as shown in FIG. 7. The gate electrode 106 may be formed using deposition and patterning techniques, which are known to one of ordinary skill in the art of transistor fabrication. For an embodiment, the thickness of the gate electrode 106 formed on the gate dielectric 105 is between 500 Å and 3500 Å. For alternate embodiments, the gate electrode 106 formed on the gate dielectric 105 may be, but is not limited to a metal, a polysilicon, polysilicon germanium, nitride, and any combination thereof.

Next, dopants are implanted into an exposed upper surface of the gate electrode 106 and, through the exposed surfaces 115 of the semiconductor layer 104, shown in FIG. 6, on the opposing sides of the gate electrode 106, into the substrate 100 to form a conductive region 107, a shallow source region 109 ("tip or extension region"), and a shallow drain region 110 ("tip or extension region"), as illustrated in FIG. 7. The gate electrode 106 serves as a mask to prevent implantation of dopants into the portion 114, which defines the channel zone of the transistor structure 121. For an embodiment, the length of the channel zone of the semiconductor transistor structure 121 is in the approximate range of 9 nanometers ("nm") to 120 nm. For one embodiment, to form an n-MOS transistor structure, the dopants are n-type dopants, for example, As ions or P ions with the concentration in the approximate range of $10^{18}$ cm$^{-3}$ to $10^{21}$ cm$^{-3}$. For another embodiment, to form a p-MOS transistor structure, the dopants are p-type dopants, for example, boron ions having the concentration in the approximate range of $10^{18}$ cm$^{-3}$ to $10^{21}$ cm$^{-3}$.

Figure 8:
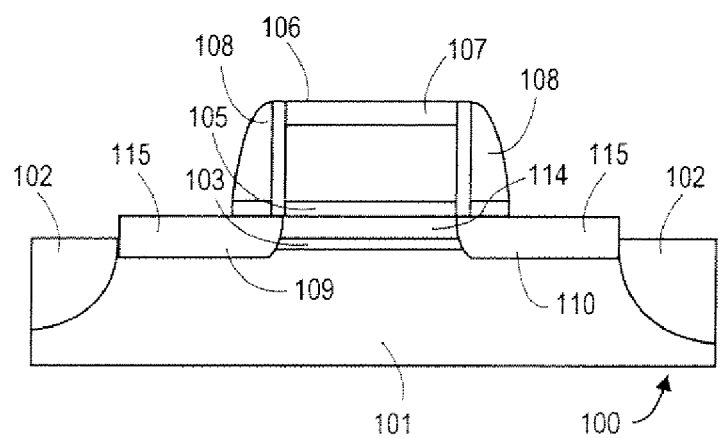
FIG. 8 is a view similar to FIG. 7 after the formation of spacers on opposing sides of the gate electrode.

FIG. 8 illustrates the semiconductor transistor structure of FIG. 7 after the formation of spacers 108 on opposing sides of the gate electrode 106. The spacers 108 cover sides of the gate electrode 106 and also cover portions of the exposed surfaces 115 adjacent and on opposing sides of the gate electrode 106. The spacers 108 may be made of an oxide material or a nitride material and formation of such spacers 108 is known to one of ordinary skill in the art of transistor fabrication.

Figure 9:
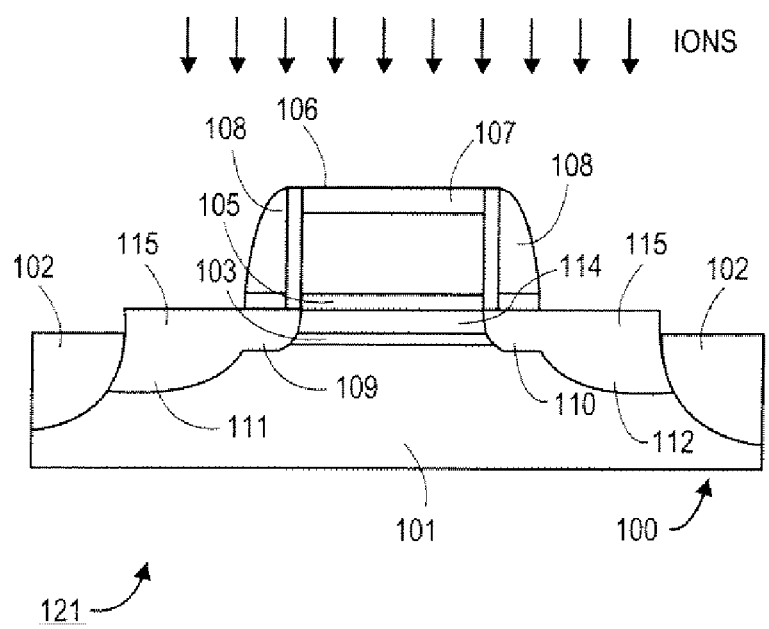
FIG. 9 is a view similar to FIG. 8 after the formation of source and drain regions on the opposing sides of the gate electrode.

FIG. 9 illustrates the semiconductor transistor structure of FIG. 8 after the formation of source and drain regions on the opposing sides of the gate electrode 106. As shown in FIG. 9, the dopants are again implanted into the upper surfaces of the gate electrode 107 and the exposed surfaces 115. The spacers 108 and the gate electrode 106 serve as a mask, which prevents implantation of the dopant ions into the regions 110 and 109 below the spacers 108 and into the portion 114 below the gate electrode. Conductive regions 111 and 112 are formed by dopant ions in the substrate 100 to a depth deeper than the regions 109 and 110. The conductive region 107 in the gate electrode 106 becomes also deeper. The doped regions 111 and 109 form a source, and doped regions 110 and 112 form a drain of the transistor structure 121. For one embodiment, to form an n-MOS transistor structure, the dopants are n-type dopants, for example, As ions or P ions having the concentration in the approximate range of $10^{18}$ cm$^{-3}$ to $10^{21}$ cm$^{-3}$. For another embodiment, to form a p-MOS transistor structure, the dopants are p-type dopants, for example, boron ions having the concentration in the approximate range of $10^{18}$ cm$^{-3}$ to $10^{21}$ cm$^{-3}$.

Figure 10:
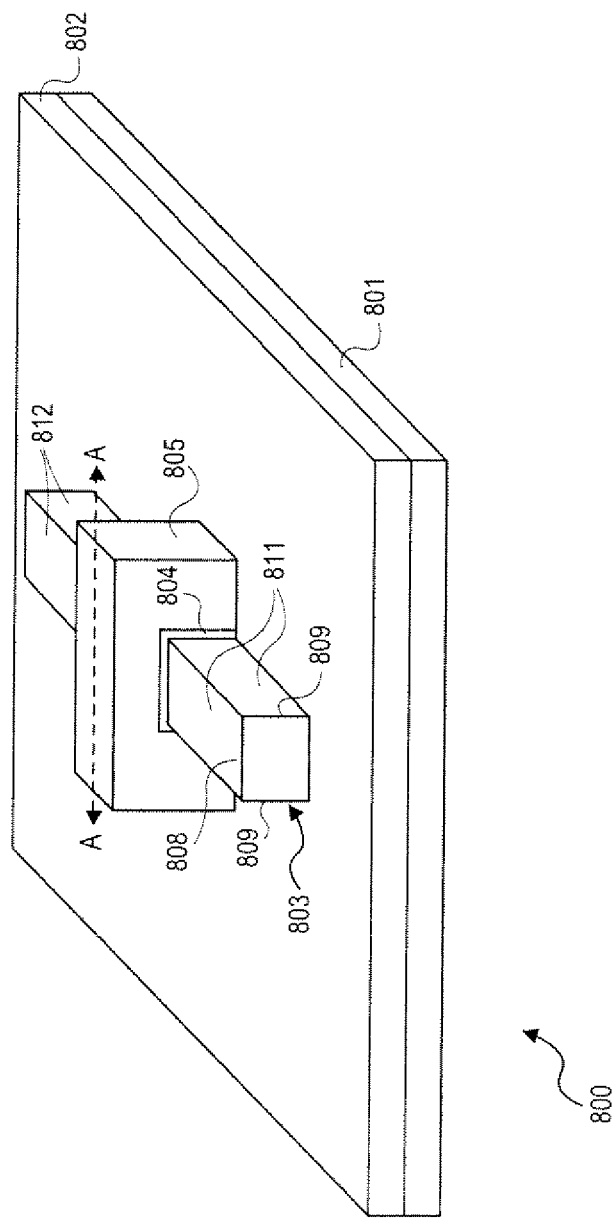
FIG. 10 is a perspective view of a non-planar semiconductor transistor structure having a channel with increased mobility according to one embodiment of the invention.

FIG. 10 is a perspective view of a non-planar semiconductor transistor structure 800 having a channel with increased mobility of the carriers according to one embodiment of the invention. The non-planar semiconductor transistor structure 800 has a source region 811 and a drain region 812 formed in a fin 803 at opposite sides of a tri-gate electrode 805. The tri-gate electrode 805 with a gate dielectric 804 covers a top 808 and two opposing sidewalls 809 of a portion of the fin 803 that allows electrical signals to be sent along the top of the transistor gate and along both vertical sidewalls. This effectively triples the space available for electrical signals to travel that gives the tri-gate transistor higher performance than planar transistors without using more power. The semiconductor layer with substantially low dopant concentration (not shown) and the diffusion barrier layer (not shown) are formed between the fin 803 and the gate dielectric 804.

For an embodiment, the fin 803 is formed on a layer 802 of a buried insulating material on a semiconductor substrate 801 using silicon-on-isolator ("SOI") technology, which is known to one of ordinary skill in the art of semiconductor fabrication. The semiconductor substrate 801 and the fin 803 include silicon, and the tri-gate electrode 805 includes polysilicon. The layer of the buried insulating material 802 includes $SiO_2$. For an embodiment, to form the n-MOS transistor structure, the drain and source dopant is an n-type dopant, for example As or P. For alternative embodiment, to form the p-MOS transistor structure, the drain and source dopant is a p-type dopant, for example, boron.

Figure 11:
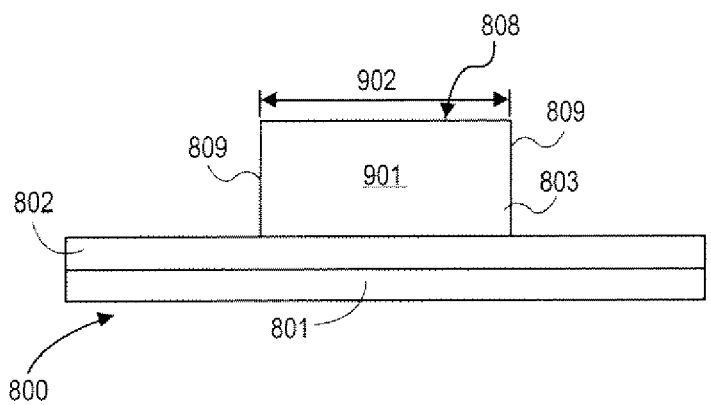
FIG. 11 is a cross-sectional view of a semiconductor structure for the non-planar semiconductor transistor structure fabrication with a fin according to one embodiment of the invention.

FIG. 11 is a cross-sectional view of the fin 803 formed on the layer 802 covering the semiconductor substrate 801 to fabricate the non-planar transistor structure 800 according to one embodiment of the invention. The fin 803 has the top 808 and the two opposing sidewalls 809, as shown in FIG. 11. The fin 803 is formed by patterning and etching of a semiconductor layer 901, which covers the layer 802 of the insulating material. The semiconductor layer 901 is doped to form a well in the semiconductor transistor structure as described above with respect to the transistor structure 121. For an embodiment, the concentration of the dopant to form the well is in the approximate range of $2 \times 10^{16}$ $cm^{-3}$ to $2 \times 10^{19}$ $cm^{-3}$. For an embodiment, to form a non-planar n-MOS transistor structure, a p-type dopant, for example boron, is added to form a p-well. For alternative embodiment, to form a non-planar p-MOS transistor structure, an n-type dopant, for example As or P, is added to form an n-well.

Further, patterning and etching of the semiconductor layer 901 to form the fin 803 may be performed by techniques known to one of ordinary skill in the art of semiconductor fabrication. For one exemplary embodiment, the width 902 of the fin 803 is in the approximate range of 20 nm to 120 nm.

Figure 12:
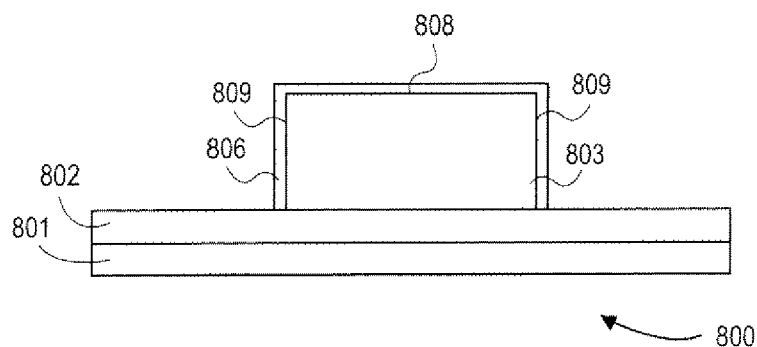
FIG. 12 is a view similar to FIG. 9, after covering the tri-gate fin by a diffusion barrier layer.

Next, a diffusion barrier layer 806 is formed on the fin 803, as described above with respect to the transistor structure 121, as shown in FIG. 12. The diffusion barrier layer 806 covers the top 808 and two opposing sidewalls 809 of the fin 803. The diffusion barrier layer 806 is formed to suppress dopant outdiffusion from the fin 803. For an embodiment, the diffusion barrier layer 806 formed on the fin 803 is substantially thin. For more specific embodiment, the thickness of the diffusion barrier layer 806 is in the approximate range of two to twenty atomic layers. For an embodiment, the diffusion barrier layer 806 includes substitutional carbon ("C"). For one embodiment, the diffusion barrier layer 806 on the fin 803 having Si can be made of any one of Si:C and SiGe:C material having the concentration of carbon in the approximate range of $10^{17}$ $cm^{-3}$ to $2 \times 10^{21}$ $cm^{-3}$.

Figure 13:
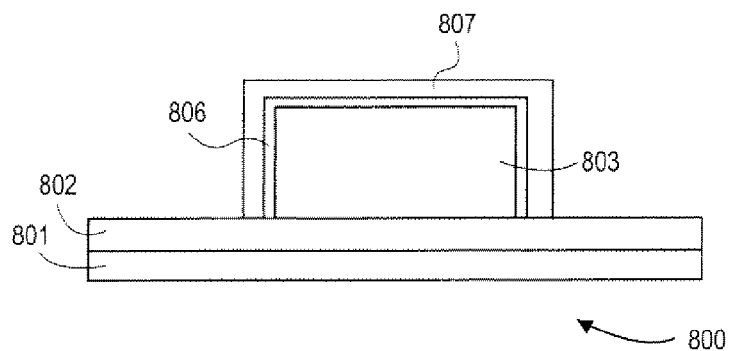
FIG. 13 is a view similar to FIG. 10, after forming a semiconductor layer with substantially low dopant concentration on the diffusion barrier layer.

A semiconductor layer 807 is formed on the diffusion barrier layer 806, as shown in FIG. 13. The semiconductor layer 807 has substantially low dopant concentration relative to the dopant concentration in the fin 803. The semiconductor layer 807 defines a channel of the non-planar transistor structure 800 with increased mobility of the carriers as described above with respect to the transistor structure 121. The semiconductor layer 807 is on the diffusion barrier layer 806 along the top 808 and two opposing sidewalls 809 of the fin 803. The semiconductor layer 807 may be formed using a technique described above with respect to the transistor structure 121. For one embodiment, the thickness of the semiconductor layer 807 formed on the diffusion barrier layer 806 is in the approximate range of 100 Å to 1000 Å. For an embodiment, the dopant concentration in the semiconductor layer 807 is less than $10^{16}$ $cm^{-3}$. For an embodiment, the semiconductor layer 807 formed on the diffusion barrier layer 806 covering the fin 803 having Si, may be any one of an intrinsic Si and SiGe.

Figure 14:
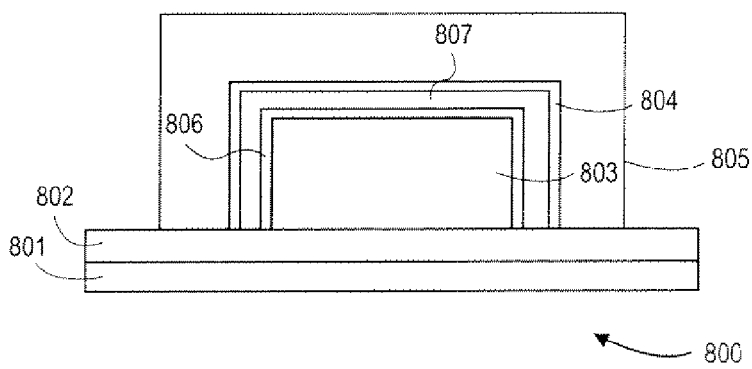
FIG. 14 is a view similar to FIG. 11, after a gate dielectric and a gate electrode are formed on the semiconductor layer with substantially low dopant concentration.

FIG. 14 is a cross-sectional view of a non-planar semiconductor transistor structure 800 across the line A-A in FIG. 10. The gate dielectric 804 and the tri-gate electrode 805 are subsequently formed on the semiconductor layer 807 as described above with respect to the transistor structure 121. The semiconductor layer 807 sandwiched between the gate dielectric 804 and the diffusion barrier layer 806 defines the channel zone with increased mobility of the carriers in the non-planar transistor structure 800. For one embodiment, the gate dielectric 804 may include any one of silicon dioxide ("$SiO_2$") or silicon nitride ("$Si_3N_4$"). For another embodiment, the gate dielectric 804 may include an oxide of a transition metal that has a dielectric constant k higher than the dielectric constant of $SiO_2$, for example, zirconium oxide ("$ZrO_2$"), hafnium oxide ("$HFO_2$"), and lanthanum oxide ("$La_2O_4$"). For an embodiment, the thickness of the gate dielectric 804 may be between 5 Å and 40 Å.

For an embodiment, the thickness of the gate electrode 805 may be between 500 Å and 3500 Å. For alternate embodiments, the gate electrode 805 includes any one of a polysilicon, polysilicon germanium, or the like metal.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed:

1. A semiconductor transistor structure, comprising:
   a semiconductor substrate having a first dopant;
   a diffusion barrier layer on the semiconductor substrate, wherein the diffusion barrier layer includes a silicon with carbon; and
   a semiconductor transistor channel layer having a substantially low dopant concentration on the diffusion barrier layer, wherein the semiconductor transistor channel layer is an intrinsic silicon germanium, wherein the semiconductor transistor channel layer is separated from the semiconductor substrate by the diffusion barrier layer that suppresses an outdiffusion of the first dopant into the semiconductor transistor channel layer.

2. The semiconductor structure of claim 1, wherein a thickness of the diffusion barrier layer is sufficient to suppress the outdiffusion of the first dopant into the semiconductor transistor channel layer.

3. The semiconductor structure of claim 2, wherein the dopant concentration of the semiconductor transistor channel layer is substantially low to form a transistor channel with an increased carrier mobility.

4. The semiconductor structure of claim 3, wherein the semiconductor substrate comprises silicon.

5. The semiconductor structure of claim 1, wherein the semiconductor substrate further comprises boron.

6. The semiconductor structure of claim 1, wherein the thickness of the diffusion barrier layer is in the approximate range of two to twenty atomic layers.

7. A method of forming a semiconductor transistor structure, comprising:
   forming a diffusion barrier layer having a second dopant on a semiconductor substrate having a first dopant, wherein the diffusion barrier layer includes a silicon layer, and the second dopant includes carbon; and
   forming a semiconductor transistor channel layer that is an intrinsic silicon germanium on the diffusion barrier layer, the semiconductor transistor channel layer being separated from the
   semiconductor substrate by the diffusion barrier layer and having a substantially low dopant concentration relative to the semiconductor substrate.

8. The method of claim 7 further comprising:
   forming any one of an n-well and a p-well in the semiconductor substrate; and
   forming isolation regions in the semiconductor substrate.

9. The method of claim 8, wherein forming a diffusion barrier layer on the semiconductor substrate is performed after forming the any one of the n-well and the p-well and forming the isolation regions in the semiconductor substrate.

10. The method of claim 9, wherein forming any one of the n-well and the p-well in the semiconductor substrate is performed by an ion implantation technique.

11. The method of claim 7, wherein forming the semiconductor transistor channel layer on the diffusion barrier layer is performed by epitaxy.

12. A transistor structure, comprising:
   a substrate having a first dopant;
   a diffusion barrier layer on the substrate, the diffusion barrier layer to suppress an outdiffusion of the first dopant, wherein the diffusion barrier layer includes a silicon with carbon;
   a semiconductor layer that is an intrinsic silicon germanium, on the diffusion barrier layer, the semiconductor layer having a substantially low dopant concentration with respect to the substrate, wherein the semiconductor layer is a transistor channel with increased carrier mobility that is separated from the substrate by the diffusion barrier layer;
   a gate dielectric on the semiconductor layer;
   a gate electrode covering the gate dielectric; and
   a source region and a drain region formed on opposing sides of the gate electrode.

13. The transistor structure of claim 12, wherein a thickness of the diffusion barrier layer is sufficient to suppress the outdiffusion of the first dopant into the semiconductor layer.

14. The transistor structure of claim 12, wherein the semiconductor layer has the substantially low dopant concentration relative to a concentration of the first dopant in the substrate.

15. The transistor structure of claim 12, wherein the first dopant comprises boron.

16. A method of forming a transistor structure, comprising:
   forming a well in a substrate;
   forming a diffusion barrier layer on the well to suppress dopant outdiffusion, wherein the diffusion barrier layer includes a silicon with carbon;
   forming a channel layer that is an intrinsic silicon germanium on the diffusion barrier layer, the channel layer being separated from the well by the diffusion barrier layer and having a substantially low dopant concentration with respect to the well;
   forming a gate dielectric on the channel layer;
   forming a gate electrode on the gate dielectric; and
   forming a source region and a drain region on opposing sides of the gate electrode.

17. The method of claim 16, wherein forming the well in the substrate is performed by an ion implantation.

18. The method of claim 17, wherein forming the diffusion barrier layer on the well is performed after forming the well in the substrate.

19. The method of claim 18, wherein forming the channel layer on the diffusion barrier layer is performed by an epitaxy.

20. A transistor structure, comprising:
   a fin having a first dopant on a substrate;
   a diffusion barrier layer covering the fin to suppress a first dopant outdiffusion, wherein the diffusion barrier layer includes a silicon with carbon;
   a semiconductor transistor channel layer that is an intrinsic silicon germanium on the diffusion barrier layer, the semiconductor transistor channel layer being separated from the fin by the diffusion barrier layer and having a substantially low dopant concentration;
   a gate dielectric on the semiconductor transistor channel layer;
   a tri-gate electrode on the gate dielectric; and
   a source region and a drain region formed in the fin on opposing sides of the tri-gate electrode.

21. The transistor structure of claim 20, wherein a thickness of the diffusion barrier layer is sufficient to suppress the outdiffusion of the first dopant into the semiconductor transistor channel layer.

22. The transistor structure of claim 20, wherein the semiconductor transistor channel layer has the substantially low dopant concentration relative to a concentration of the first dopant in the fin.

23. The transistor structure of claim 20, wherein the fin comprises any one of silicon and silicon germanium.

24. The transistor structure of claim 23, wherein the first dopant further comprises boron.

25. A method of forming a transistor structure, comprising:
   forming a fin on a substrate;
   forming a diffusion barrier layer covering the fin, wherein the diffusion barrier layer includes a silicon with carbon;
   forming a semiconductor transistor channel layer that is an intrinsic silicon germanium on the diffusion barrier layer, the semiconductor transistor channel layer being separated from the fin by the diffusion barrier layer and having a substantially low dopant concentration to provide a channel with increased carrier mobility;
   forming a gate dielectric on the semiconductor transistor channel layer;
   forming a gate electrode covering the gate dielectric; and
   forming a source region and a drain region on opposing sides of the gate electrode.

26. The method of claim 25, wherein forming the diffusion barrier layer on the fin is performed after forming any one of an n-well and a p-well in the fin.

27. The method of claim 25, wherein forming the semiconductor transistor channel layer is performed by an epitaxy.

28. The method of claim 25, wherein the diffusion barrier layer is formed to a thickness sufficient enough to suppress the outdiffusion of the first dopant into the semiconductor transistor channel layer.

* * * * *